United States Patent
Cheng et al.

(10) Patent No.: US 11,706,525 B2
(45) Date of Patent: Jul. 18, 2023

(54) IMAGE SENSOR INCLUDING LIGHT SHIELDING LAYER AND PATTERNED DIELECTRIC LAYER

(71) Applicant: Taiwan Semiconductor Manufacturing Company, Ltd., Hsinchu (TW)

(72) Inventors: Yun-Wei Cheng, Taipei (TW); Chun-Hao Chou, Tainan (TW); Hsin-Chi Chen, Tainan (TW); Kuo-Cheng Lee, Tainan (TW); Hsun-Ying Huang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/493,752

(22) Filed: Oct. 4, 2021

(65) Prior Publication Data
US 2022/0030158 A1    Jan. 27, 2022

Related U.S. Application Data

(63) Continuation of application No. 16/699,752, filed on Dec. 2, 2019, now Pat. No. 11,140,309, which is a
(Continued)

(51) Int. Cl.
*H04N 5/232*    (2006.01)
*H04N 23/67*    (2023.01)
(Continued)

(52) U.S. Cl.
CPC ......... *H04N 23/67* (2023.01); *H01L 27/1463* (2013.01); *H01L 27/14603* (2013.01);
(Continued)

(58) Field of Classification Search
CPC .......... H04N 5/23212; H04N 9/04557; H04N 9/04555; H04N 5/36961; H04N 5/3696;
(Continued)

(56) References Cited

U.S. PATENT DOCUMENTS

2009/0278966 A1* 11/2009 Kusaka ............. H04N 9/04557
                                                        348/294
2014/0339615 A1* 11/2014 Wang ................. H01L 27/14629
                                                        257/294
(Continued)

*Primary Examiner* — Hung H Lam
(74) *Attorney, Agent, or Firm* — JCIPRNET

(57) ABSTRACT

An image sensor including a semiconductor substrate, a plurality of color filters, a plurality of first lenses and a second lens is provided. The semiconductor substrate includes a plurality of sensing pixels arranged in array, and each of the plurality of sensing pixels respectively includes a plurality of image sensing units and a plurality of phase detection units. The color filters at least cover the plurality of image sensing units. The first lenses are disposed on the plurality of color filters. Each of the plurality of first lenses respectively covers one of the plurality of image sensing units. The second lens is disposed on the plurality of color filters and the second lens covers the plurality of phase detection units.

20 Claims, 14 Drawing Sheets

Related U.S. Application Data continuation of application No. 15/866,481, filed on Jan. 10, 2018, now Pat. No. 10,498,947.

(60) Provisional application No. 62/578,531, filed on Oct. 30, 2017.

(51) Int. Cl.
| | |
|---|---|
| *H01L 27/146* | (2006.01) |
| *H04N 23/10* | (2023.01) |
| *H04N 25/133* | (2023.01) |
| *H04N 25/13* | (2023.01) |
| *H04N 25/702* | (2023.01) |
| *H04N 25/704* | (2023.01) |
| *H04N 5/369* | (2011.01) |

(52) U.S. Cl.
CPC .. *H01L 27/14621* (2013.01); *H01L 27/14627* (2013.01); *H01L 27/14689* (2013.01); *H04N 23/10* (2023.01); *H04N 25/133* (2023.01); *H04N 25/134* (2023.01); *H04N 25/702* (2023.01); *H04N 25/704* (2023.01)

(58) Field of Classification Search
CPC .............. H04N 9/045; H01L 27/1463; H01L 27/14689; H01L 27/14621; H01L 27/14627; H01L 27/14603; H01L 27/14645

See application file for complete search history.

(56) References Cited

U.S. PATENT DOCUMENTS

2018/0247967 A1* 8/2018 Kawano .............. H01L 21/0214
2019/0052823 A1* 2/2019 Jung ................. H04N 5/36961

\* cited by examiner

IMAGE SENSOR INCLUDING LIGHT SHIELDING LAYER AND PATTERNED DIELECTRIC LAYER

CROSS-REFERENCE TO RELATED APPLICATION

This is a continuation application of and claims the priority benefit of U.S. application Ser. No. 16/699,752, filed on Dec. 2, 2019, now allowed. The U.S. application Ser. No. 16/699,752 is a continuation application of and claims the priority benefit of U.S. application Ser. No. 15/866,481, filed on Jan. 10, 2018, U.S. Pat. No. 10,498,947, issued on Dec. 3, 2019, which claims the priority benefit of US provisional application Ser. No. 62/578,531, filed on Oct. 30, 2017. The entirety of each of the above-mentioned patent applications is hereby incorporated by reference herein and made a part of this specification.

BACKGROUND

Compared to charge coupled device (CCD) sensors, a Complementary Metal-Oxide-Semiconductor (CMOS) image sensor has many advantages such as low voltage operation, low power consumption, compatibility with logic circuitry, random access, and low cost. Among the CMOS image sensors, a phase detection auto-focus (PDAF) CMOS image sensor is widely used because the PDAF CMOS image sensor provides excellent auto focus function. In the PDAF CMOS image sensor, some photodiodes are partially shielded by metallic grid to provide phase detection function. The photodiodes partially shielded by metallic grid will result in lower incident signal when pixel size of the PDAF CMOS image sensor shrinks. Accordingly, the performance of the PDAF CMOS image sensor is compromised.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
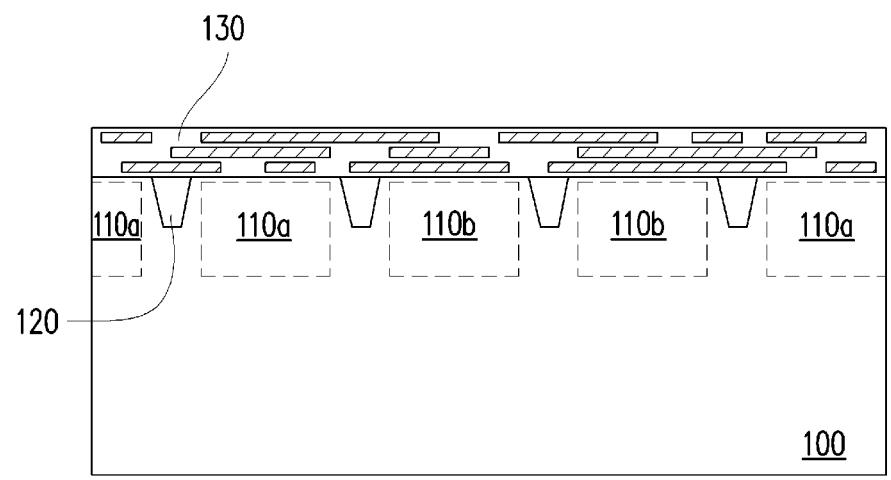
FIGS. 1 through 5 schematically illustrate a process flow for fabricating an image sensor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 6:
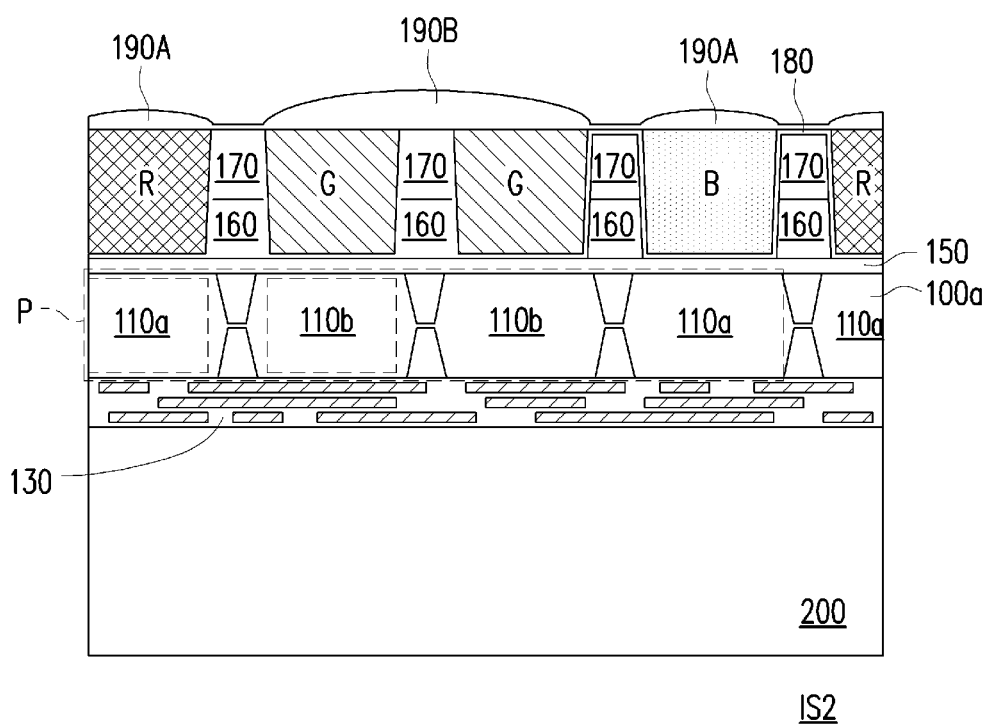
FIG. 6 schematically illustrates a cross-sectional view of image sensor in accordance with other embodiments of the present disclosure.
Figure 7:
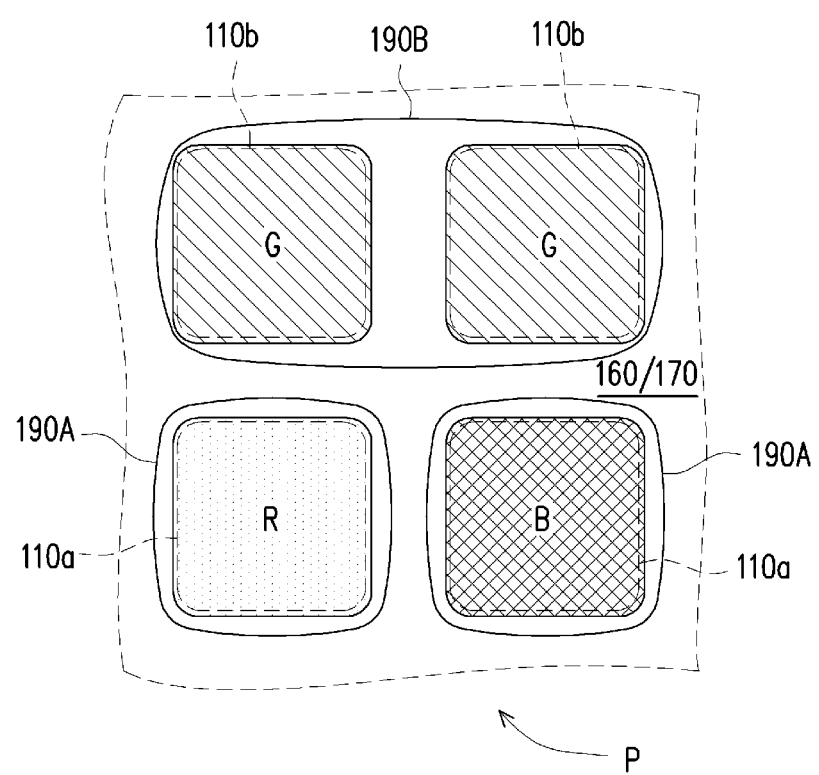
FIG. 7 schematically illustrates a top view of an image sensor in accordance with some embodiments of the present disclosure.
Figure 8:
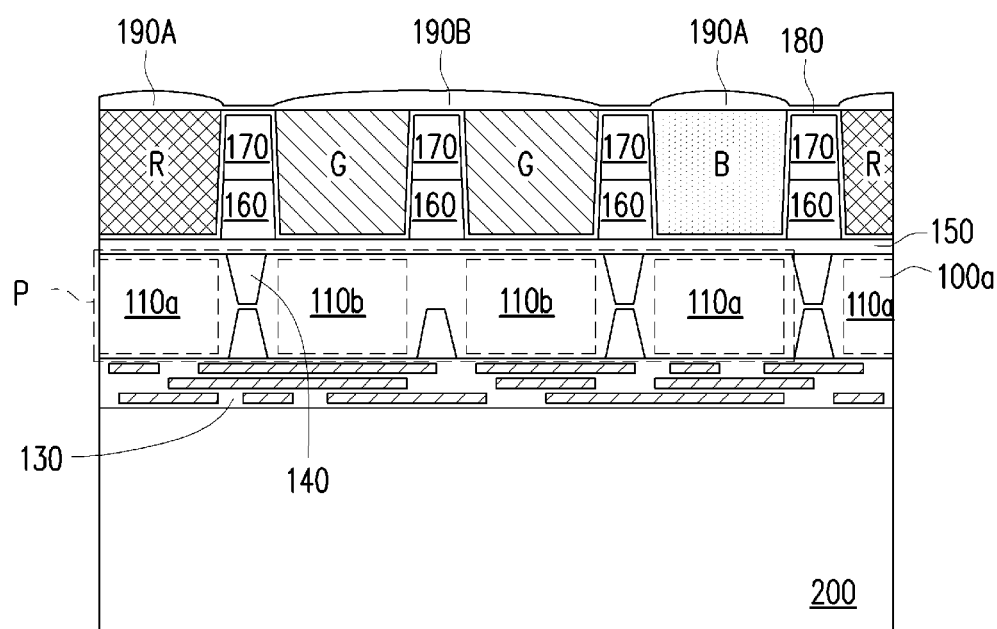
FIGS. 8 and 9 schematically illustrate cross-sectional views of image sensors in accordance with other embodiments of the present disclosure.
Figure 9:
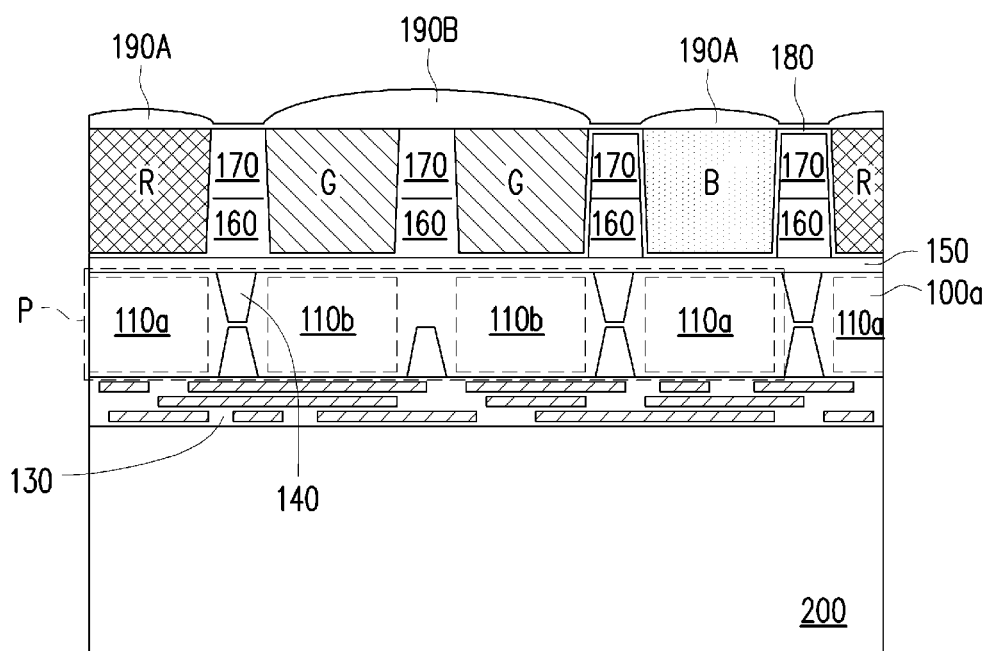

FIGS. 1 through 5 schematically illustrate a process flow for fabricating an image sensor in accordance with some embodiments of the present disclosure; FIG. 6 schematically illustrates a cross-sectional view of image sensor in accordance with other embodiments of the present disclosure; FIG. 7 schematically illustrates a top view of an image sensor in accordance with some embodiments of the present disclosure; and FIGS. 8 and 9 schematically illustrate cross-sectional views of image sensors in accordance with other embodiments of the present disclosure.

Referring to FIG. 1, a semiconductor substrate 100 (e.g., a semiconductor wafer) is provided. A plurality of trench isolations 120 may be formed in the semiconductor substrate 100 so as to define a plurality of active regions in the semiconductor substrate 100. For example, the trench isolations 120 are shallow trench isolations (STI). A plurality of image sensing units 110a and 110b are formed in the active regions defined in the semiconductor substrate 100. For example, the image sensing units 110a and 110b are photodiodes, wherein each of the photodiodes may include at least one p-type doped region, at least one n-type doped region, and a p-n junction formed between the p-type doped region and the n-type doped region. In detail, when the semiconductor substrate 100 is a p-type substrate, n-type dopants, such as phosphorous or arsenic, may be doped into the active regions so as to form n-type wells, and the resulting p-n junctions in semiconductor substrate 100 are able to perform the image sensing function and phase detection function. Similarly, when the semiconductor substrate 100 is an n-type substrate, p-type dopants, such as boron of BF2, may be doped into the active regions so as to form p-type wells, and the resulting p-n junctions in the semiconductor substrate 100 are able to perform the image sensing function and phase detection function. Detailed descriptions of ion implantation processes for forming n-type doped regions (n-wells) or p-type doped regions (p-wells) are omitted herein. In some alternatively embodiments, the image sensing units 110a and 110b may be other photoelectric elements capable of performing image sensing and phase detection function. When a reversed bias is applied to the p-n junctions of the image sensing units 110a and 110b, the p-n junctions are sensitive to an incident light. The light received or detected by the image sensing units 110a and 110b is converted into photo-current such that analog signal representing intensity of the incident light and the photo-current is generated.

After formation of the image sensing units 110a and 110b, a logic circuit may be formed on the semiconductor substrate 100. The logic circuit is designate for receiving and processing signal originated from the image sensing units 110a and 110b. The logic circuit, for example, includes conductive traces and NAND/NOR, gates. A material of the logic circuit may include, but not limited to, metal and polysilicon. It should be noted that the location of the logic circuit is not limited on the semiconductor substrate 100. In some alternative embodiments, the logic circuits may be fabricated on other elements formed subsequently, and the explanations will be discussed later.

As shown in FIG. 1, an interconnection layer 130 is formed on the semiconductor substrate 100. The interconnection layer 130 is disposed on and electrically connected to the image sensing units 110a and 110b such that signal generated from the image sensing units 110a and 110b may be transmitted to other components for processing. For example, analog signal generated from the image sensing units 110a and 110b is transmitted by the interconnection layer 130 to other components, such as an analog-to-digital converter (ADC), for processing. In some embodiment, the interconnection layer 130 includes conductive trace layers and interlayer dielectric layers stacked alternately, but they construe no limitation in the disclosure. In some alternative embodiments, certain foregoing layers within the interconnection layer 130 may be omitted, as long as the signal of the image sensing units 110a and 110b are able to be transmitted to other components for processing. Suitable material for the conductive trace layers includes conductors such as metal. It is noted that the conductive trace layers may be made of a same material or different materials, and may include a singe layer of metallic traces or multiple layers of metallic traces. In a scenario where multiple layers of metallic traces are found in the trace layers, interlayer dielectric layers (ILD) are inserted between each metallic trace layer. A material of the ILD layer includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof.

Figure 2:
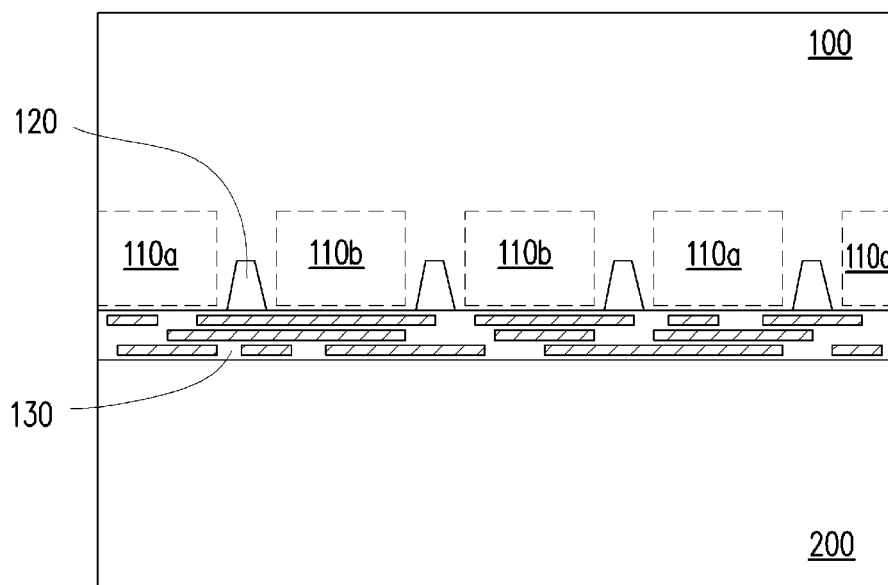

Referring to FIG. 2, the semiconductor substrate 100 having the interconnection layer 130 formed thereon may be bonded to a support substrate 200. In some embodiments, the semiconductor substrate 100 and the support substrate 200 are semiconductor substrates are silicon substrates or substrates made by other suitable materials. The material of the semiconductor substrate 100 may be the same as that of the support substrate 200. For example, the semiconductor substrate 100 and the support substrate 200 are semiconductor wafers, and a wafer bonding process may be performed such that the semiconductor substrate 100 is flipped and the interconnection layer 130 formed on the semiconductor substrate 100 is bonded to the support substrate 200. After the semiconductor substrate 100 and the support substrate 200 are bonded, the interconnection layer 130 is between the support substrate 200 and the image sensing units 110a and 110b.

Figure 3:
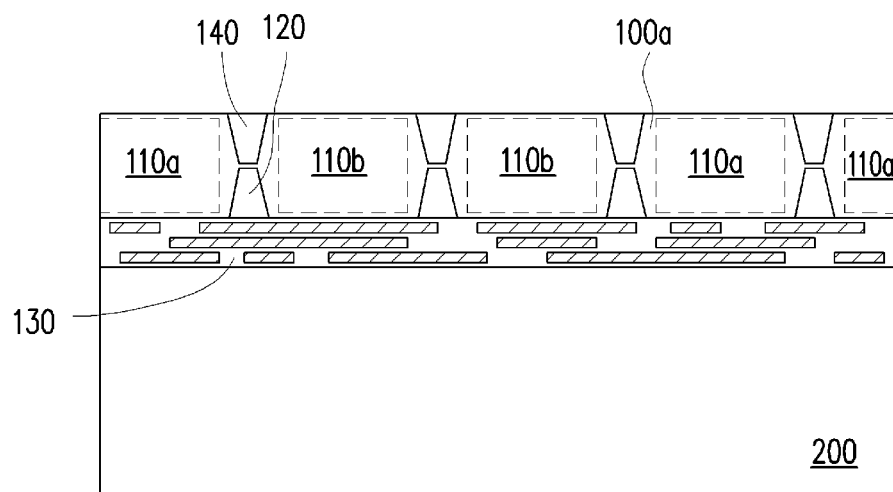

Referring to FIG. 2 and FIG. 3, a thinning process of the semiconductor substrate 100 may be performed so as to form a thinned semiconductor substrate 100a. In some embodiments, a back polishing process of the semiconductor substrate 100 is performed to reduce the thickness of the semiconductor substrate 100. In other words, the back surface of the semiconductor substrate 100 which is opposite to the interconnection layer 130 is polished. The method for back polishing includes mechanical polishing and/or chemical polishing. For example, in some embodiments, the back polishing is achieved by chemical mechanical polishing (CAW), and in some alternative embodiments, the back polishing is attained by chemical etching. The disclosure does not construe the polishing method, as long as the semiconductor substrate 100 is polished to render a desired thickness.

The support substrate 200 provides sufficient structural support (e.g., rigidity) so as to facilitate the thinning process of the semiconductor substrate 100. Due to the supporting of the support substrate 200, the image sensing units 110a and 110b in the thinned semiconductor substrate 100a are not damaged during the thinning process.

Referring to FIG. 3, in order to enhance electrical isolation in between the image sensing units 110a and 110b and minimize leakage, a plurality of trench isolations 140 may be formed in the thinned semiconductor substrate 100a. For example, the trench isolations 140 are deep trench isolations (DTI). The aspect ratio of the trench isolations 140 may be greater than that of the trench isolation 120. The trench isolations 140 may be substantially aligned with the trench isolations 120. In some embodiments, the trench isolations 140 in the thinned semiconductor substrate 100a may extend toward the trench isolations 120 and may be in contact with the trench isolations 120. In some alternative embodiments, the trench isolations 140 in the thinned semiconductor substrate 100a may extend toward the trench isolations 120 and may be spaced apart from the trench isolations 120.

Figure 4:
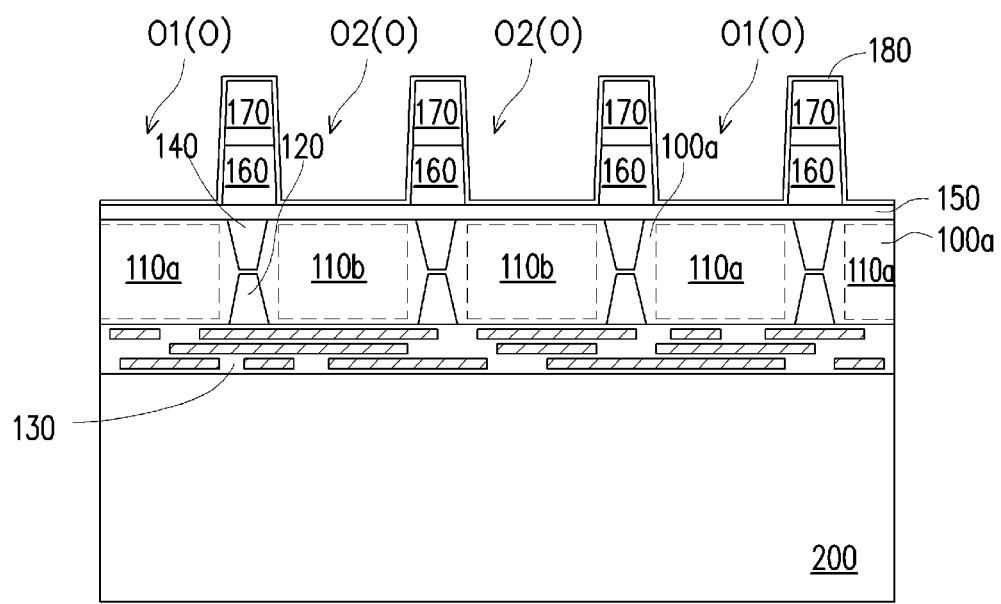

Referring to FIG. 3 and FIG. 4, in some embodiment, a planarization layer 150 having a flat top surface may be formed to cover the thinned semiconductor substrate 100a and the trench isolations 140. For example, the material of the planarization layer 150 includes silicon oxide or other suitable dielectric materials. In some alternative embodiments, the fabrication of the planarization layer 150 may be omitted.

A light shielding layer including a light shielding grid layer 160 and a patterned dielectric layer 170 is formed on the planarization layer 150. The patterned dielectric layer 170 is formed on the top of the light shielding grid layer 160. The light shielding grid layer 160 and the patterned dielectric layer 170 may be formed by a same patterning process (e.g., a photolithography and etch process). For example, the material of the light shielding grid layer 160 includes metal, alloy or the like; and the material of the patterned dielectric layer 170 includes silicon oxide or other suitable dielectric materials. The light shielding layer including the light shielding grid layer 160 and the patterned dielectric layer 170 may include a plurality of openings O located above the image sensing units 110a and 110b. Portions of the planarization layer 150 are exposed by the openings O. The openings O formed in the light shielding layer may be classified into a plurality of first openings O1 and at least one second opening O2, wherein the first openings O1 are located corresponding to the image sensing units 110a and the at least one second opening O2 is located corresponding to the image sensing units 110a.

In some embodiments, the number and the location of the first openings O1 are corresponding to those of the image sensing units 110a while the number and the location of the second openings O2 are corresponding to those of the image sensing units 110b. As shown in FIG. 4, a pair of the image sensing units 110b and two of the second openings O2 which are corresponding to the pair of image sensing units 110b are illustrated. Each of the first openings O1 is respectively corresponding to one of the image sensing units 110a while each of the second openings O2 is respectively corresponding to one of the image sensing units 110b. However, the number and the location of the openings O (i.e. the first openings O1 and the second openings O2) are not limited in the present disclosure.

After the light shielding grid layer 160 and the patterned dielectric layer 170 are formed, a protection layer 180 is formed to cover the planarization layer 150, the light shielding grid layer 160 and the patterned dielectric layer 170. As shown in FIG. 4, the protection layer 180 conformity covers the light shielding layer (160/170) and the portions of the planarization layer 150 which are exposed by the first openings O1 and the second opening O2. For example, the material of the protection layer 180 includes silicon oxide or other suitable dielectric materials.

Figure 5:
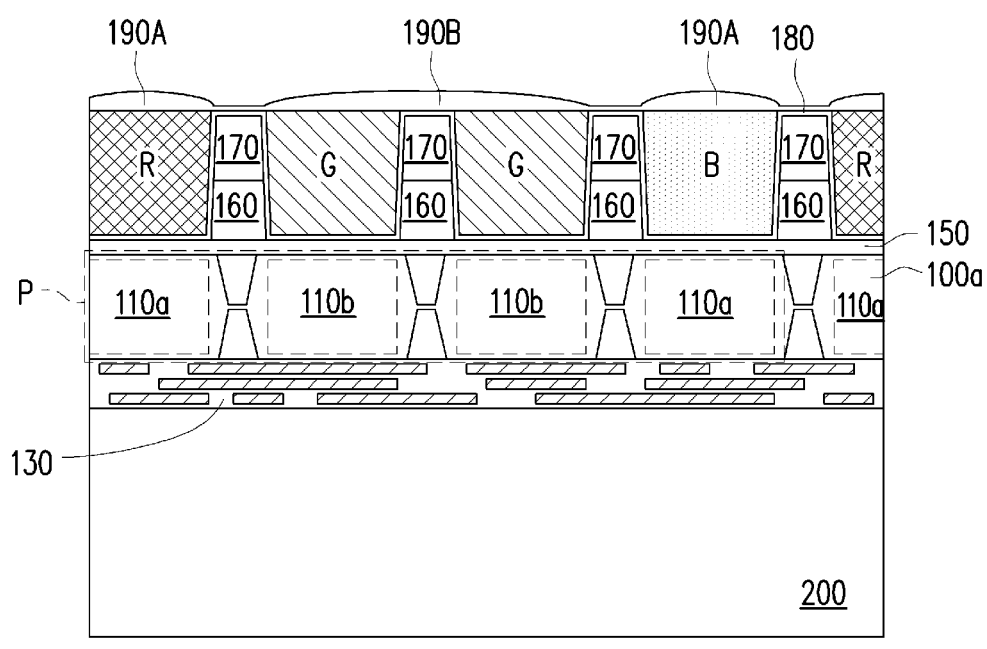

Referring to FIG. 4 and FIG. 5, color filters R, color filters G and color filters B are formed to fill the openings O defined in the light shielding layer (160/170) such that the thinned semiconductor substrate 100a is between the color filters R, G and B and the interconnection structure 130. The color filters R and the color filters B are formed to fill the first openings O1 while the color filters G are formed to fill the second openings O2. For example, the color filters R may be red color filters R, the color filters G may be green color filters, and the color filters B may be blue color filters. The color filters R allow red light passing through such that the red light is received by the image sensing units 110a located below the color filters R; the green color filters G allow green light passing through such that the green light is received by the image sensing units 110b located below the color filters G; and the blue color filters B allow blue light passing through such that the blue light is received by the image sensing units 110a located below the color filters B. In some embodiments, the red color filters R, the green color filters G and the blue color filters B may be formed by different photoresist materials and the photoresist materials for forming the red color filters R, the green color filters G and the blue color filters B may be patterned through photolithography processes, for example.

In some embodiments, the red color filters R, the green color filters G and the blue color filters B may merely fill in the openings O defined in the light shielding layer (160/170). In some alternative embodiments, not shown in FIG. 5, the red color filters R, the green color filters G and the blue color filters B may not only fill in the openings O defined in the light shielding layer (160/170), but also covers the top surface of the light shielding layer (160/170).

After forming the color filters R, G and B, a plurality of first lenses 190A and at least one second lens 190B are formed to cover the color filters R, G and B. In some alternative embodiments, the first lenses 190A and the at least one second lens 190B may cover the top surface of the light shielding layer (160/170) and the color filters R, G and B. The first lenses 190A cover the color filters R, the color filters B and the image sensing units 110b while the at least one second lens 190B covers the color filters G and the image sensing units 110b. In other words, the color filters R and the color filters B are between the image sensing units 110a and the first lenses 190A while the color filters G are between the image sensing units 110b and the at least one second lens 190B. As shown in FIG. 5, each one of the first lenses 190A and the at least one second lens 190B may be a micro-lens and the first lenses 190A and the at least one second lens 190B may constitute a micro-lens array.

Referring to FIG. 5, an image sensor IS1 having phase detection auto focus (PDAF) function is illustrated. The image sensor IS1 includes the thinned semiconductor substrate 100a, the color filters R, G and B, the first lenses 190A and the at least one second lens 190B. The thinned semiconductor substrate 100a includes a plurality of sensing pixels P arranged in array. Each of the sensing pixels P includes the image sensing units 110a and 110b, respectively. The color filters R, G and B cover the image sensing units 110a and 110b. The first lenses 190A are disposed on the color filters R and the color filters B, and each of the first lenses 190A respectively covers one of the image sensing units 110a. The at least one second lens 190B is disposed on the color filters G. The at least one second lens 190B covers the pair of the image sensing units 110b. The at least one second lens 190B and the image sensing units 110b covered by the at least one second lens 190B may provide phase detection function. Namely, the image sensing units 110b may serve as phase detection units. In such embodiment, the image sensing units 110a are able to merely perform the image sensing function while the image sensing units 110b are able to perform the image sensing function and phase detection function. In other words, in at least one of the sensing pixels P of the image sensor IS1, the image sensing units 110a are sub-pixels with no phase detection function and the image sensing units 110b are sub-pixels with phase detection function. For example, only portions of the sensing pixels P may include the image sensing units 110a and 110b to provide phase detection function while the rest of the sensing pixels P may include the image sensing units 110a and does not provide phase detection function. In some embodiments, one pair of the image sensing units 110b having phase detection function is required in the image sensor IS1. In some alternative embodiments, pairs of the image sensing units 110b having phase detection function are required in the image sensor IS1.

In some embodiments, in the image sensor IS1 shown in FIG. 5, the height (i.e. first height) of each one of the first lenses 190A is substantially equal to the height (i.e. second height) of the at least one second lens 190B; and the curvature of each one of the first lenses 190A smaller than the curvature of the at least one second lens 190B. In some alternative embodiments, in the image sensor IS2 shown in FIG. 6, the height (i.e. the first height) of each one of the first lenses 190A is less than the height (i.e. the second height) of the at least one second lens 190B; and the curvature of each one of the first lenses 190A is substantially equal to the curvature of the at least one second lens 190B.

As shown FIG. 7, in at least one sensing pixel P of the image sensor IS1, the coverage (i.e. first coverage) of each one of the first lenses 190A is less than the coverage (i.e. second coverage) of the at least one second lens 190B. The coverage of each one of the first lenses 190A is corresponding to and greater than the area of one of the image sensing units 110a. The coverage of the at least one second lens 190B is corresponding to and greater than the areas of the pair of the image sensing units 110b. In other words, the pair of the image sensing units 110b share the at least one second lens 190B. The at least one second lens 190B not only covers the pair of the image sensing units 110b and the color filters G, but also covers a portion of the light shielding layer (160/170) between the pair of the image sensing units 110b. Since the image sensing units 110b are not partially shielded by the light shielding layer (160/170), the pair of image sensing units 110b may result in excellent incident signal when size of sensing pixels P shrinks.

Referring to FIG. 8, the image sensor IS3 is similar with the image sensor IS1 illustrated in FIG. 5 except that the trench isolations 140 are not formed between the image sensing units 110b. The trench isolations 140 are not formed below the second lens 190B. In other words, the second lens 190B does not cover the trench isolations 140 formed in the thinned semiconductor substrate 100a.

Referring to FIG. 9, the image sensor IS4 is similar with the image sensor IS2 illustrated in FIG. 6 except that the trench isolations 140 are not formed between the image sensing units 110b. The trench isolations 140 are not formed below the second lens 190B. In other words, the second lens 190B does not cover the trench isolations 140 formed in the thinned semiconductor substrate 100a.

Figure 10:
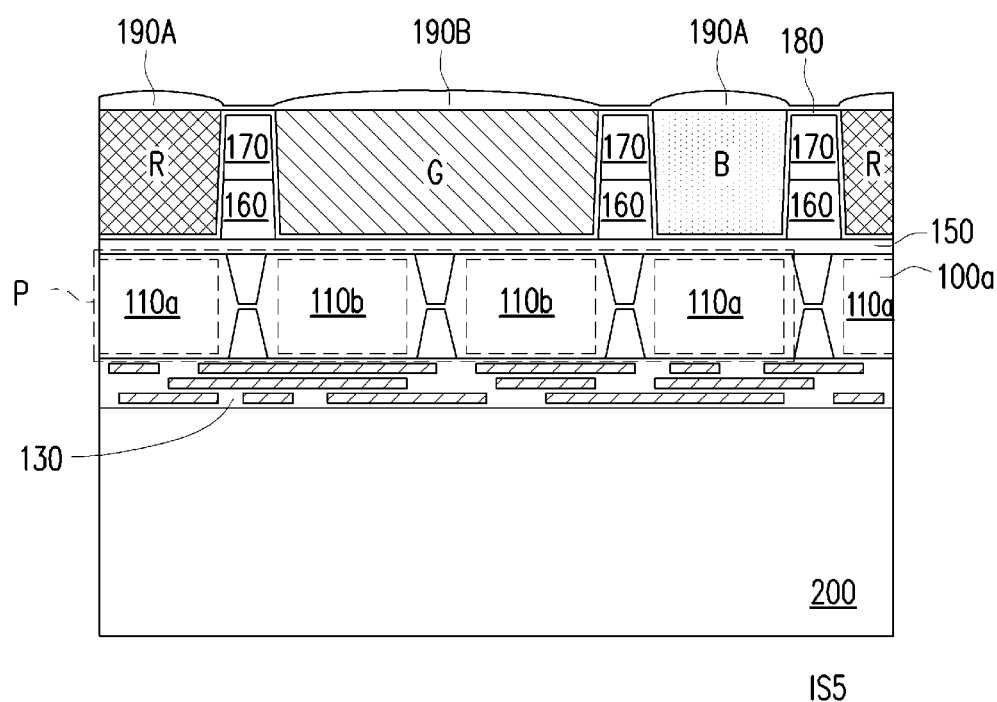
FIG. 10 schematically illustrates a cross-sectional view of an image sensor in accordance with some alternative embodiments of the present disclosure.
Figure 11:
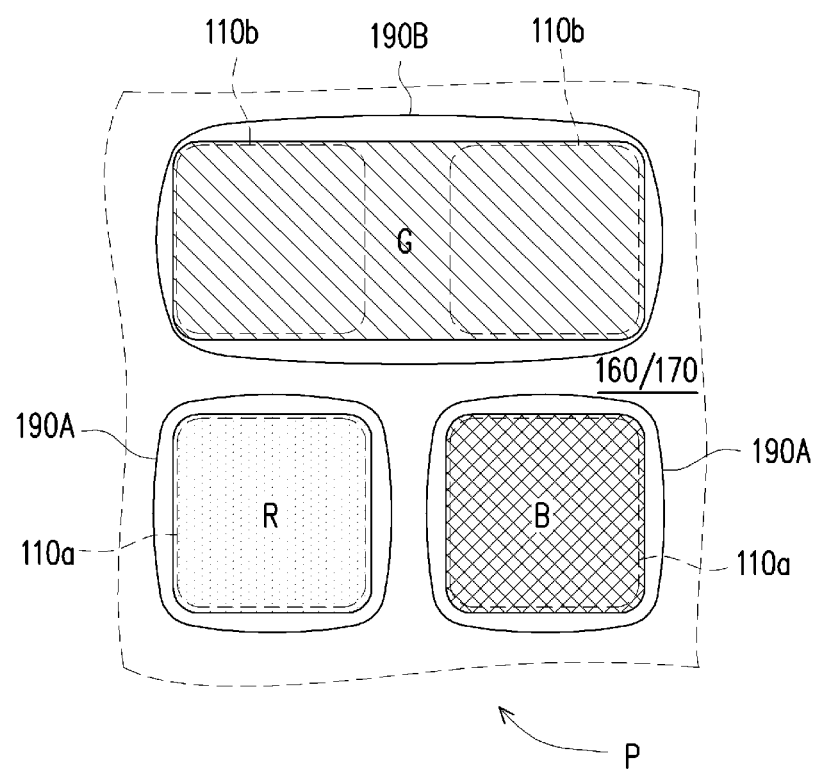
FIG. 11 schematically illustrates a top view of an image sensor in accordance with some embodiments of the present disclosure.

FIG. 10 schematically illustrates a cross-sectional view of an image sensor in accordance with some alternative embodiments of the present disclosure; FIG. 11 schematically illustrates a top view of an image sensor in accordance with some embodiments of the present disclosure; and FIGS. 12 through 16 schematically illustrate cross-sectional views of image sensors in accordance with other embodiments of the present disclosure.

Referring to FIG. 10 and FIG. 11, the image sensor IS5 is similar with the image sensor IS1 illustrated in FIG. 1 except that the light shielding layer (160/170) are not formed below the second lens 190B. In other words, the second lens 190B does not cover the light shielding layer (160/170).

As shown in FIG. 10 and FIG. 11, in at least one sensing pixel P of the image sensor IS5, the coverage (i.e. first coverage) of each one of the first lenses 190A is less than the coverage (i.e. second coverage) of the at least one second lens 190B. The coverage of each one of the first lenses 190A is corresponding to and greater than the area of one of the image sensing units 110a. The coverage of the at least one second lens 190B is corresponding to and greater than the areas of the pair of the image sensing units 110b. The color filter G not only covers the pair of the image sensing units 110b, but also covers an area between the pair of the image sensing units 110b. In other words, the image sensing units 110b share the at least one second lens 190B and share the color filter G. Since the image sensing units 110b are not partially shielded by the light shielding layer (160/170), the pair of image sensing units 110b may result in excellent incident signal when size of sensing pixels P shrinks.

Figure 12:
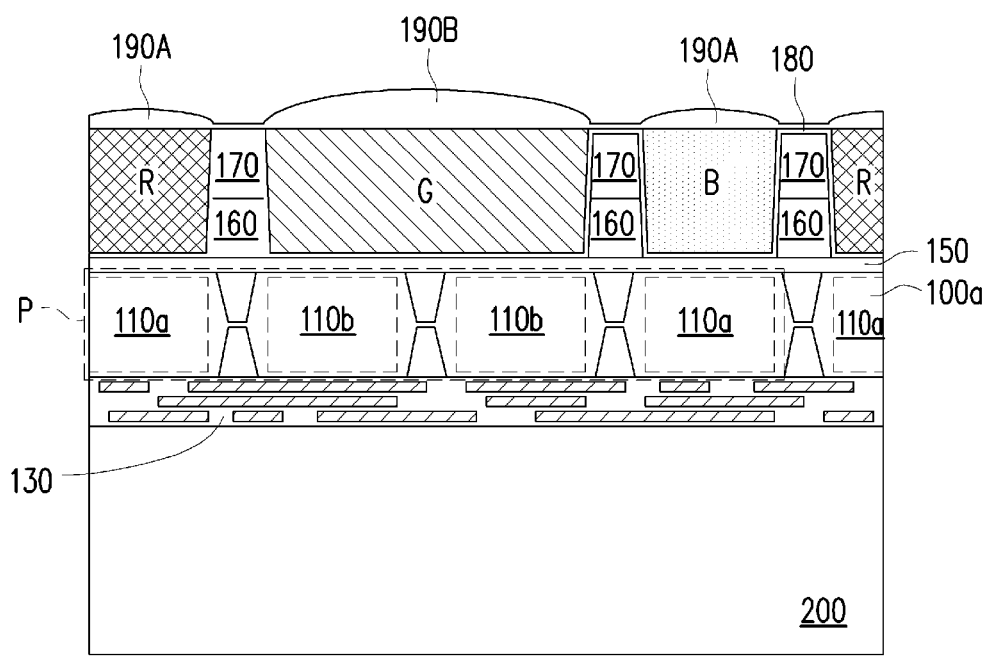
FIGS. 12 through 16 schematically illustrate cross-sectional views of image sensors in accordance with other embodiments of the present disclosure.

In the image sensor IS6 shown in FIG. 12, the height (i.e. the first height) of each one of the first lenses 190A is less than the height (i.e. the second height) of the at least one second lens 190B; and the curvature of each one of the first lenses 190A is substantially equal to the curvature of the at least one second lens 190B.

Figure 13:
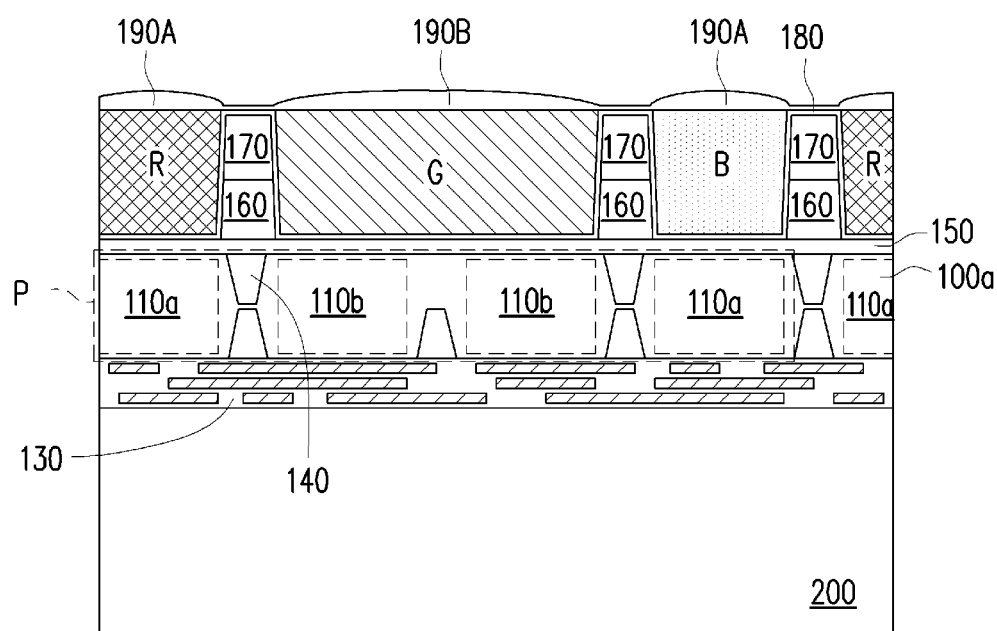

Referring to FIG. 13, the image sensor IS7 is similar with the image sensor IS5 illustrated in FIG. 10 except that the trench isolations 140 are not formed between the image sensing units 110b. The trench isolations 140 are not formed below the second lens 190B. In other words, the second lens 190B does not cover the trench isolations 140 formed in the thinned semiconductor substrate 100a.

Figure 14:
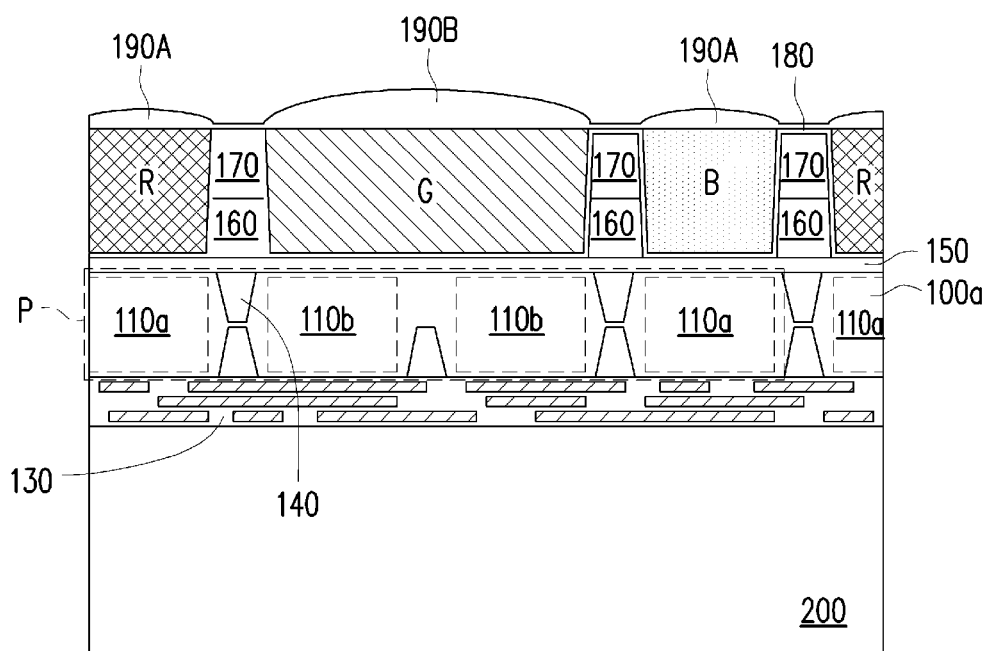

Referring to FIG. 14, the image sensor IS8 is similar with the image sensor IS6 illustrated in FIG. 12 except that the trench isolations 140 are not formed between the image sensing units 110b. The trench isolations 140 are not formed below the second lens 190B. In other words, the second lens 190B does not cover the trench isolations 140 formed in the thinned semiconductor substrate 100a.

Figure 15:
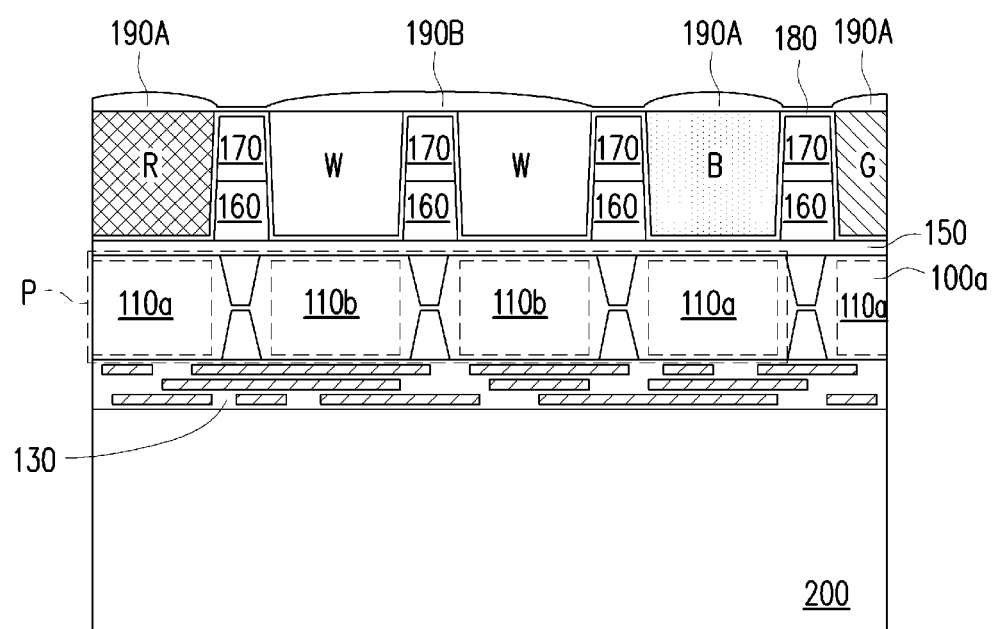

Referring to FIG. 15, an image sensor IS9 including a semiconductor substrate 100a, a plurality of color filters R, G and B, a plurality of first lenses 190A and at least one second lens 190B is illustrated. The semiconductor substrate 100a includes a plurality of sensing pixels P arranged in array. Each of the sensing pixels P respectively includes a plurality of image sensing units 110a and a plurality of phase detection units 110b. The color filters R, G and B at least cover the image sensing units 110a. For example, the color filters R, G and B fill portions of the openings which are located above the image sensing units 110a. The first lenses 190A are disposed on the color filters R, G and B. Each of the first lenses 190A respectively covers one of the image sensing units 110a. The at least one second lens 190B does not cover the color filters R, G and B. The at least one second lens 190B covers the phase detection units 110b. For example, as shown in FIG. 15, the phase detection units 110b are not covered by the color filters R, G and B.

As shown in FIG. 15, in some embodiments, a pair of transparent fillers W may be formed above the phase detection units 110b and the phase detection units 110b may serve as white sub-pixels of the sensing pixels P. The transparent fillers W may be spaced apart by the light shielding layer (160/170) which is located below the at least one second lens 190B. In some alternative embodiments, the phase detection units 110b may merely provide phase detection function and do not serve as white sub-pixels of the sensing pixels P. It is noted that the design of trench isolation 140 illustrated in FIG. 8 may be applied to the image sensor IS9 shown in FIG. 15.

Figure 16:
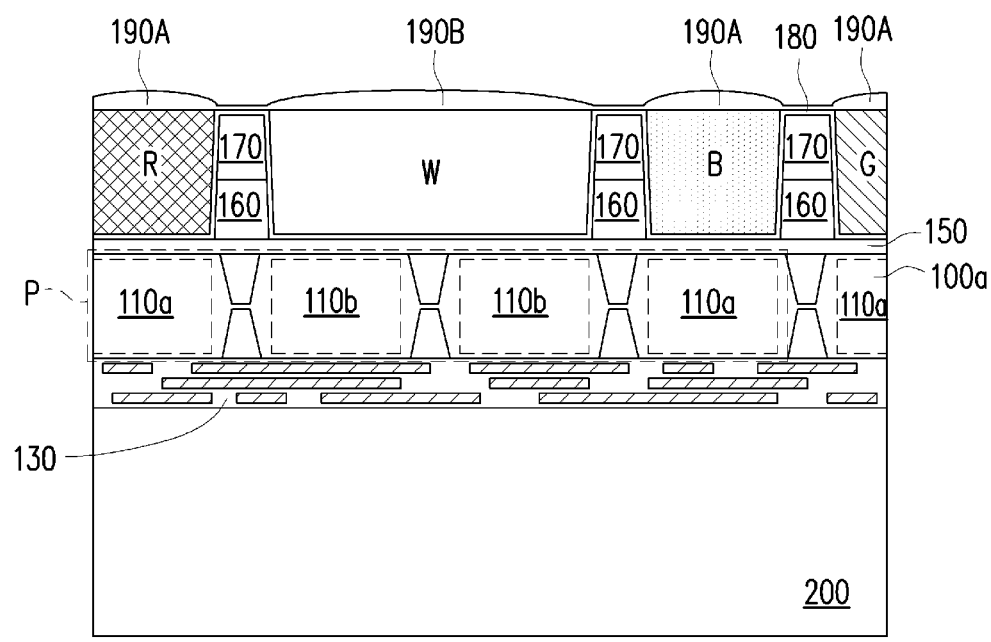

Referring to FIG. 16, the image sensor IS10 is similar with the image sensor IS9 illustrated in FIG. 15 except that the light shielding layer (160/170) are not formed below the second lens 190B. In other words, the second lens 190B does not cover the light shielding layer (160/170). It is noted that the design of trench isolation 140 illustrated in FIG. 13 may be applied to the image sensor IS10 shown in FIG. 16.

In the above-mentioned embodiments, since the phase detection units and the image sensing units 110b are not partially shielded, the phase detection units and the image sensing units 110b may receive sufficient incident light and result in excellent incident signal when pixel size of the image sensor shrinks.

According to some embodiments, an image sensor including a semiconductor substrate, a plurality of color filters, a plurality of first lenses and a second lens is provided. The semiconductor substrate includes a plurality of sensing pixels arranged in array, and each of the plurality of sensing pixels respectively includes a plurality of image sensing units and a plurality of phase detection units. The color filters at least cover the plurality of image sensing units. The first lenses are disposed on the plurality of color filters, and each of the plurality of first lenses respectively covers one of the plurality of image sensing units. The second lens covers the plurality of phase detection units.

According to some alternative embodiments, an image sensor including a semiconductor substrate, a plurality of color filters, a plurality of first lens and a plurality of second lenses is provided. The semiconductor substrate includes a plurality of sensing pixels arranged in array, and each of the plurality of sensing pixels respectively includes a plurality of image sensing units. The color filters cover the plurality of image sensing units. The first lenses are disposed on the plurality of color filters, and each of the plurality of first lenses respectively cover one of the plurality of image sensing units. Each of the plurality of second lenses respectively covers at least two of the plurality of image sensing units. The plurality of second lenses and portions of the plurality of image sensing units covered by the plurality of second lenses provide phase detection function.

According to some alternative embodiments, an image sensor including a semiconductor substrate, a light shielding layer, a plurality of color filters, a plurality of first lenses and a second lens is provided. The semiconductor substrate includes a plurality of sensing pixels arranged in array, and each of the plurality of sensing pixels respectively includes a plurality of image sensing units and a plurality of phase detection units. The light shielding layer includes a plurality of openings located above the plurality of image sensing units and the plurality of phase detection units. The color filters at least fill portions of the openings located above the plurality of image sensing units. The first lenses are disposed on the plurality of color filters, and each of the plurality of first lenses respectively covers one of the plurality of image sensing units. The second lens covers the plurality of phase detection units.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
a semiconductor substrate comprising sensing pixels, each sensing pixel comprising a first sub-pixel, a second sub-pixel and a pair of third sub-pixels with phase detection function;
color filters disposed over the sensing pixels;
lenses covering the color filters; and
a grid structure disposed between the color filters and located over the isolation structures, wherein the grid structure comprises:
a shielding grid layer; and
a dielectric grid layer covering the shielding grid layer, wherein the color filters are space apart from each other by the grid structure.

2. The image sensor as claimed in claim 1,
wherein the color filters comprise:
first color filters disposed over the first sub-pixels of the sensing pixels;
second color filters disposed over the second sub-pixel of the sensing pixels; and
third color filters disposed over the third sub-pixels of the sensing pixels;
wherein the lenses comprise:
first lenses covering the first color filters;
second lenses covering the second color filters; and
third lenses, each of the third lenses covering one pair of third sub-pixels among the pairs of third sub-pixels.

3. The image sensor as claimed in claim 2, wherein a first coverage of each first lens among the first lenses and a second coverage of each second lens among the second lenses is less than a third coverage of each third lens among the third lenses.

4. The image sensor as claimed in claim 3, wherein the first coverage is substantially equal to the second coverage.

5. The image sensor as claimed in claim 2, wherein the first color filters are red color filters, the second color filters are blue color filters, and the third color filters are green color filters.

6. The image sensor as claimed in claim 2, wherein the first color filters allow a first light passing through such that the first light is received by the first sub-pixels, the second color filters allow a second light passing through such that the second light is received by the second sub-pixels, the third color filters allow a third light passing through such that the third light is received by the pairs of third sub-pixels, and the first light, the second light and third light are different in wavelength.

7. The image sensor as claimed in claim 1, wherein the semiconductor substrate further comprises isolation structure disposed between the first sub-pixels, the second sub-pixels and the third sub-pixels.

8. The image sensor as claimed in claim 1, wherein the semiconductor substrate further comprises an interconnection structure disposed on and electrically connected to the first sub-pixels, the second sub-pixels and the pairs of third sub-pixels.

9. An image sensor, comprising:
a semiconductor substrate comprising sensing pixels arranged in array, each sensing pixel comprising a first sub-pixel, a second sub-pixel and a pair of photo detecting regions;
first color filters disposed on the semiconductor substrate, each first sub-pixel being respectively covered by one of the first color filters;
second color filters disposed on the semiconductor substrate, each second sub-pixel being respectively covered by one of the second color filters;
third color filters disposed on the semiconductor substrate, each pair of photo detecting regions being respectively covered by one of the third color filters;
first lenses covering the first color filters;
second lenses covering the second color filters; and
third lenses, each of the third lenses covering one pair of photo detecting regions among the pairs of photo detecting regions, wherein a first coverage of each one first lens among the first lenses or a second coverage of each one second lens among the second lenses is different from a third coverage of each one third lens among the third lenses,
the grid structure has rounded corners as viewed from a top view, wherein the grid structure comprises:
a metallic grid layer; and
a dielectric grid layer covering the metallic grid layer, wherein the first color filters are space apart from the second color filters by the grid structure.

10. The image sensor as claimed in claim 9, wherein the first coverage is substantially equal to the second coverage.

11. The image sensor as claimed in claim 9, wherein the first color filters are disposed between the first sub-pixels and the first lenses, the second color filters are disposed between the second sub-pixels and the second lenses, and the third color filters are disposed between the pairs of photo detecting regions and the third lenses.

12. The image sensor as claimed in claim 9, wherein the first color filters are red color filters, the second color filters are blue color filters, and the third color filters are green color filters.

13. The image sensor as claimed in claim 9, wherein
the first color filters allow a first light passing through such that the first light is received by the first sub-pixels,
the second color filters allow a second light passing through such that the second light is received by the second sub-pixels,
the third color filters allow a third light passing through such that the third light is received by the pairs of photo detecting regions, and
the first light, the second light and third light are different in wavelength.

14. The image sensor as claimed in claim 9, wherein the semiconductor substrate further comprising trench isolations between the first sub-pixels and the second sub-pixels, and a grid structure between the first and second color filters is disposed over the trench isolations.

15. The image sensor as claimed in claim 9, wherein the semiconductor substrate further comprises an interconnection structure disposed on and electrically connected to the first sub-pixels, the second sub-pixels and the pairs of photo detecting regions.

16. An image sensor, comprising:
a semiconductor substrate having a first side and a second side opposite the first side;
dielectric materials disposed within trenches defined by interior surfaces of the semiconductor substrate, the trenches extending from the first side toward the second side;
a plurality of detecting regions provided within the semiconductor substrate;
a grid structure disposed on the first side of the semiconductor substrate, wherein the grid structure extends away from the trenches, wherein a portion the grid structure is spaced apart from a directly adjacent portion of the grid structure by a first distance, and the portion of the grid structure is spaced apart from another directly adjacent portion of the grid structure by a second distance greater than the first distance; and
a region defined by the portion of the grid structure and the another directly adjacent portion of the grid structure corresponds to two detecting regions among the plurality of detecting regions.

17. The image sensor as claimed in claim 16 further comprising an interconnection layer disposed on the second side of the semiconductor substrate, wherein the plurality of detecting regions are electrically connected to the interconnection layer.

18. The image sensor as claimed in claim 17 further comprising a support substrate, wherein the interconnection layer is between the semiconductor substrate and the support substrate.

19. The image sensor as claimed in claim 16, wherein the grid structure comprises:
a shielding grid layer; and
a dielectric grid layer covering the shielding grid layer.

20. The image sensor as claimed in claim 16, wherein the first side is a light-receiving side of the semiconductor substrate.

* * * * *